(12) United States Patent
Herner et al.

(10) Patent No.: US 10,079,331 B2
(45) Date of Patent: Sep. 18, 2018

(54) HIGH INDEX DIELECTRIC FILM TO INCREASE EXTRACTION EFFICIENCY OF NANOWIRE LEDS

(71) Applicant: GLO AB

(72) Inventors: Scott Brad Herner, Lafayette, CO (US); Xiaoming Ji, Sunnyvale, CA (US)

(73) Assignee: GLO AB, Lund (SE)

( * ) Notice: Subject to any disclaimer, the term of this patent is extended or adjusted under 35 U.S.C. 154(b) by 69 days.

(21) Appl. No.: 14/776,340

(22) PCT Filed: Mar. 12, 2014

(86) PCT No.: PCT/US2014/024805
§ 371 (c)(1),
(2) Date: Sep. 14, 2015

(87) PCT Pub. No.: WO2014/151034
PCT Pub. Date: Sep. 25, 2014

(65) Prior Publication Data
US 2016/0035941 A1    Feb. 4, 2016

Related U.S. Application Data

(60) Provisional application No. 61/791,739, filed on Mar. 15, 2013.

(51) Int. Cl.
*H01L 33/44* (2010.01)
*H01L 33/08* (2010.01)
(Continued)

(52) U.S. Cl.
CPC .......... *H01L 33/44* (2013.01); *H01L 33/0075* (2013.01); *H01L 33/06* (2013.01);
(Continued)

(58) Field of Classification Search
CPC ...................................................... H01L 33/44
See application file for complete search history.

(56) References Cited

U.S. PATENT DOCUMENTS

7,335,908 B2    2/2008    Samuelson et al.
7,396,696 B2    7/2008    Kim et al.
(Continued)

FOREIGN PATENT DOCUMENTS

JP     2005191220 A    7/2005
JP     2008251616 A    10/2008
(Continued)

OTHER PUBLICATIONS

Ozen et al., The influence of Voltage applied between the electrodes on optical and morphological properties of the InGaN thin films grown by thermionic vacuum arc, Scanning vol. 9999, 1-7 (2015).*
(Continued)

*Primary Examiner* — Matthew Reames
*Assistant Examiner* — Christopher Culbert
(74) *Attorney, Agent, or Firm* — The Marbury Law Group PLLC

(57) ABSTRACT

Various embodiments include semiconductor devices, such as nanowire LEDs, that include a plurality of first conductivity type semiconductor nanowire cores located over a support, a plurality of second conductivity type semiconductor shells extending over and around the respective nanowire cores, and a layer of a high index of refraction material over at least a portion of a surface of at least one of the nanowire cores and the shells, wherein the high index of refraction material has an index of refraction that is between about 1.4 and about 4.5. Light extraction efficiency may be improved.

23 Claims, 8 Drawing Sheets

(51) Int. Cl.
  *H01L 33/24* (2010.01)
  *H01L 33/32* (2010.01)
  *H01L 33/00* (2010.01)
  *H01L 33/06* (2010.01)
  *H01L 33/18* (2010.01)
  *H01L 33/42* (2010.01)

(52) U.S. Cl.
  CPC .............. *H01L 33/08* (2013.01); *H01L 33/24* (2013.01); *H01L 33/32* (2013.01); *H01L 33/18* (2013.01); *H01L 33/42* (2013.01)

(56) References Cited

U.S. PATENT DOCUMENTS

| | | | |
|---|---|---|---|
| 7,829,443 | B2 | 11/2010 | Seifert et al. |
| 8,350,251 | B1* | 1/2013 | Lowgren ................. H01L 33/06 257/13 |
| 2003/0161023 | A1* | 8/2003 | Gillin ..................... H01S 3/063 359/247 |
| 2005/0139842 | A1 | 6/2005 | Murofushi et al. |
| 2008/0149944 | A1 | 6/2008 | Samuelson et al. |
| 2009/0267049 | A1 | 10/2009 | Cho et al. |
| 2011/0297955 | A1* | 12/2011 | Wang ...................... H01L 33/24 257/76 |
| 2011/0309382 | A1 | 12/2011 | Lowgren |
| 2012/0050742 | A1* | 3/2012 | Sano ........................ G01J 3/26 356/416 |
| 2012/0270345 | A1 | 10/2012 | Samuelson et al. |
| 2013/0015477 | A1* | 1/2013 | Kim ....................... H01L 33/24 257/94 |

FOREIGN PATENT DOCUMENTS

| | | |
|---|---|---|
| JP | 2009076896 A | 4/2009 |
| JP | 2009147140 A | 7/2009 |
| JP | 2009193975 A | 8/2009 |
| JP | 2009542560 A | 12/2009 |
| JP | 2014165205 A | 9/2014 |
| KR | 1020090111810 | 10/2009 |
| KR | 1020130008306 A | 1/2013 |
| WO | WO2007102781 A1 | 9/2007 |
| WO | WO2007136000 A1 | 11/2007 |
| WO | WO2008048704 A2 | 4/2008 |
| WO | WO2010014032 A1 | 2/2010 |
| WO | WO2011067872 A1 | 6/2011 |
| WO | WO2013080174 A1 | 6/2013 |
| WO | WO2014150800 A1 | 3/2014 |
| WO | WO2014066371 A1 | 5/2014 |
| WO | WO2014066379 A1 | 5/2014 |
| WO | WO2014143991 A1 | 9/2014 |

OTHER PUBLICATIONS

International Preliminary Report or Patentability and Written Opinion of the International Searching Authority for International Application No. PCT/US2014/069429, dated Jun. 23, 2016, 8 pages.
European Office Communication and Extended Supplementary European Search Report for European Patent Application No. 14769403.8, dated Oct. 10, 2016, 8 pages.
International Search Report and written Opinion for PCT/US2014/024805, dated Sep. 25, 2014.
Written Opinion of the International Searching Authority issued in PCT Application No. PCT/US14/24805, dated Aug. 7, 2014.
International Preliminary Report on Patentability issued in PCT Application No. PCT/US14/24805, dated Sep. 15, 2015.
Japanese Office Communication, First Office Action from Japan Patent Office for Japanese Patent Application No. 2016-501645, dated Dec. 28, 2017, 8 pages.

* cited by examiner

HIGH INDEX DIELECTRIC FILM TO INCREASE EXTRACTION EFFICIENCY OF NANOWIRE LEDS

RELATED APPLICATION

CROSS-REFERENCE TO OTHER APPLICATIONS

This application is a national phase application under 35 U.S.C. § 371 of international application PCT/US14/024805, filed Mar. 12, 2015 which claims the benefit of priority to U.S. Provisional Application No. 61/791,739 filed on Mar. 15, 2013, the entire teachings of which are incorporated herein by reference.

BACKGROUND

Nanowire light emitting diodes (LED) are of increasing interest as an alternative to planar LEDs. In comparison with LEDs produced with conventional planar technology, nanowire LEDs offer unique properties due to the three-dimensional nature of the nanowires, improved flexibility in materials combinations due to less lattice matching restrictions and opportunities for processing on larger substrates.

Despite the advantages of nanowire LEDs, further improvements in the light extraction efficiency of nanowire LEDs would be desirable.

SUMMARY

Embodiments include a semiconductor device that includes a plurality of first conductivity type semiconductor nanowire cores located over a support, a plurality of second conductivity type semiconductor shells extending over and around the respective nanowire cores, and a layer of a high index of refraction material over at least a portion of a surface of at least one of the nanowire cores and the shells, wherein the high index of refraction material has an index of refraction that is between about 1.4 and about 4.5.

In various embodiments, the semiconductor device may be a nanowire LED, and the first conductivity type semiconductor nanowire core and the second conductivity type semiconductor shell may be configured to form a pn or pin junction that in operation provides an active region for light generation. The nanowire LED may generate light in at least one emission wavelength in the visible, ultraviolet or infrared range, and the high index of refraction material has an index of refraction that is between about 1.4 and about 4.5 for the at least one emission wavelength.

Further embodiments include methods of fabricating a semiconductor device having a layer of a high index of refraction material.

BRIEF DESCRIPTION OF THE DRAWINGS

The accompanying drawings, which are incorporated herein and constitute part of this specification, illustrate example embodiments of the invention, and together with the general description given above and the detailed description given below, serve to explain the features of the invention.

DETAILED DESCRIPTION

Figure 1:
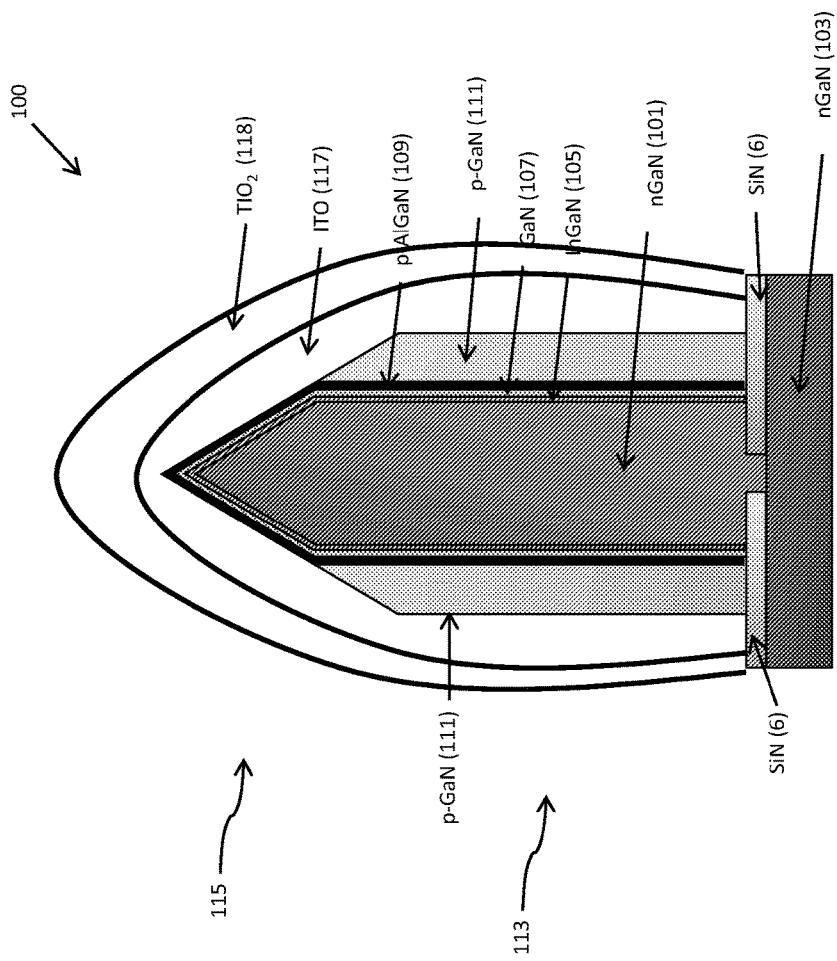
FIG. 1 schematically illustrates a side cross sectional view of a nanowire LED having a layer of a high index of refraction material over a surface of the nanowire LED.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

Embodiments of the invention include nanowire-based semiconductor devices, such as nanowire LEDs, and methods of fabricating nanowire LEDs, with improved light extraction efficiency. Nanowire LEDs, such as GaN nanowire LEDs, show promise in increasing the efficiency and wavelength stability compared to conventional planar LEDs. However, the light extraction efficiency of such devices may not be optimal due to light guiding and loss of light out the side(s) of the device.

Various embodiments include a nanowire LED having a layer of a high index of refraction material and high transmission of light over at least a portion of a surface of the nanowire LED. The layer may be a transparent film, and may have an index of refraction, n, that is between about 1.4 and about 4.5 (e.g., 2.0-2.5, such as 2.2-2.4) for at least one emission wavelength of the LED, which may be a visible, infrared (IR) or ultraviolet (UV) wavelength. In one embodiment, the at least one emission wavelength of the nanowire LED may be a visible wavelength, such as between 390-700 nm (e.g., 450-550 nm). The addition of a transparent, high index of refraction material layer may improve the light extraction efficiency, and therefore the external quantum efficiency, of nanowire LED devices, such as GaN nanowire LED devices.

The high index of refraction material may be an electrically insulating material that is provided over at least a portion of a tip of the nanowire LED and/or over at least a portion of a sidewall of the nanowire LED. The nanowire LED may have an electrically-conductive contact material (e.g., a transparent conductive oxide (TCO), such as indium tin oxide (ITO)) over at least a portion of a surface of the nanowire LED, and the high index layer may be provided over the transparent electrically-conductive contact material. The nanowire LED may have a shape of a pillar or of a truncated cone or pyramid such that at least one sidewall extends between a base end, proximate to a support substrate, to a tip end having a substantially flat surface. Alternatively, the nanowire LED may have a substantially conical- or pyramid-shaped tip. In either of these cases, the high index of refraction material layer may be provided over the tip end and may extend at least partially down the sidewall of the nanowire. An LED structure may comprise a plurality of nanowire LEDs arranged side-by-side on a supporting substrate to form a nanowire LED array, and the high-index of refraction material layer may be provided over all or a portion of the nanowire LED array.

The high index of refraction material, with typical high index of >1.5 for visible light and thickness from about 100 Å to about 20,000 Å, may be formed over a nanowire LED using any suitable process, such as by physical vapor deposition (PVD) (e.g., evaporation from a solid source, sputtering, etc.), by chemical vapor deposition (CVD), or by atomic layer deposition (ALD). The high index of refraction material layer may have a high transmissivity (e.g., greater than 85%, such as greater than 90% or 95%) at the at least one emission wavelength of the nanowire LED (e.g., >95%, such as 96-99% at 450-550 nm), and low loss. The high index of refraction material may be an oxide or nitride material, such as titanium oxide (e.g., stochiometric $TiO_2$ or non-stochiometric Ti rich or Ti poor titanium oxide), silicon nitride (e.g., stochiometric $Si_3N_4$ or non-stochiometric silicon rich or silicon poor silicon nitride), and/or silicon oxynitride ($SiO_xN_y$). Other suitable materials include NiO, AlN, $V_2O_5$, $ZrO_2$, CoO, or $LiNbO_3$.

It is known that physical deposition of materials such as ITO or $TiO_2$ on the sidewalls of substantially vertical features such as nanowires can result in a low density film on the sidewalls. This low density film on the sidewall will have an effectively lower index of refraction than a high density film of the same material, such as that deposited on more substantially planar areas such as the areas between nanowires. For example, evaporated ITO may have an effective index of refraction n=2.0 for the film between the wires, and an effective n=1.4 for the film on the sidewall of the wires. The evaporated $TiO_2$ may have an n=2.4 for the film between the wires, and n=1.7 on the sidewalls of the wires. For the purposes of this application, we will consider the high index of refraction film to have an effectively higher index of refraction than its underlying film. Hence, $TiO_2$ with effective n=1.7 may not be considered high index, but when deposited on ITO with n=1.2, it has a higher index. This is only caused by low density films. Films deposited by chemical vapor deposition will, in general, have a more uniform density and index of refraction on both horizontal and vertical features, than films deposited by evaporation.

In the art of nanotechnology, nanowires are usually interpreted as nanostructures having a lateral size (e.g., diameter for cylindrical nanowires or width for pyramidal or hexagonal nanowires) of nano-scale or nanometer dimensions, whereas its longitudinal size is unconstrained. Such nanostructures are commonly also referred to as nanowhiskers, one-dimensional nano-elements, nanorods, nanotubes, etc. The nanowires can have a diameter or width of up to about 2 micron. The small size of the nanowires provides unique physical, optical and electronic properties. These properties can for example be used to form devices utilizing quantum mechanical effects (e.g., using quantum wires) or to form heterostructures of compositionally different materials that usually cannot be combined due to large lattice mismatch. As the term nanowire implies, the one dimensional nature may be associated with an elongated shape. Since nanowires may have various cross-sectional shapes, the diameter is intended to refer to the effective diameter. By effective diameter, it is meant the average of the major and minor axis of the cross-section of the structure. Although in the figures the nano elements are shown to be pillar-like and based on nanowire cores, it should be noted that the cores can also have other geometries such as pyramids with various polygonal bases, such as square, hexagonal, octagonal, etc. Thus, as used herein, the core may comprise any suitable element having a width or diameter of less than 2 microns and a length greater than 1 micron and may comprise a single structure or a multi-component structure. For example, the core may comprise a semiconductor nanowire of one conductivity type or it may comprise the semiconductor nanowire of one conductivity type surrounded by one or more semiconductor shells of the same conductivity type and the core having a pillar or pyramid shape. For simplicity, a single component nanowire pillar core will be described below and illustrated in the figures.

All references to upper, top, lower, downwards etc. are made as considering the substrate being at the bottom and the nanowires extending upwards from the substrate. Vertical refers to a direction perpendicular to the plane formed by the substrate, and horizontal to a direction parallel to the plane formed by the substrate. This nomenclature is introduced for the easy of understanding only, and should not be considered as limiting to specific assembly orientation etc.

In embodiment methods, a layer of a transparent, high index of refraction material (e.g., n=1.7-4.5, such as n=2.0-2.5, including n=2.2-2.4) may formed over at least a portion of a surface of the nanowire LED. The high index layer may be an oxide or nitride material, such as $TiO_2$ and/or $Si_3N_4$, and may be formed over a nanowire LED using any suitable process, such as by physical vapor deposition (PVD) (e.g., evaporation from a solid source or sputtering), or by chemical vapor deposition (CVD). The addition of a transparent, high index of refraction material may improve the extraction efficiency, and therefore the external quantum efficiency, of nanowire LED devices.

Any suitable nanowire LED structure as known in the art may be used in the methods of the invention.

An example nanowire LED having a high index of refraction layer is illustrated in FIG. 1. In this example, a nanowire LED 100 includes a n-GaN 101 core in electrical contact with an n-GaN buffer layer 103, intermediate layers or shells of InGaN/GaN quantum well active region 105, 107, and p-AlGaN 109 and P-GaN 111 outer shells, with a vertical sidewall 113 and a conical tip 115. In various embodiments, described further below, the conical tip may be partially or completely eliminated to provide a nanowire structure having a substantially flat surface at the tip end. A layer of electrical contact material (ITO) 117 is provided over the outer layer of p-GaN, and a layer of high index of refraction material ($TiO_2$) 118 is provided over the ITO layer 117.

Nanowire LEDs are typically based on one or more pn- or p-i-n-junctions. The difference between a pn junction and a p-i-n-junction is that the latter has a wider active region. The wider active region allows for a higher probability of recombination in the i-region. Each nanowire comprises a first conductivity type (e.g., n-type) nanowire core and an enclosing second conductivity type (e.g., p-type) shell for forming a pn or pin junction that in operation provides an active region for light generation. While the first conductivity type of the core is described herein as an n-type semiconductor core and the second conductivity type shell is described herein as a p-type semiconductor shell, it should be understood that their conductivity types may be reversed.

Figure 2:
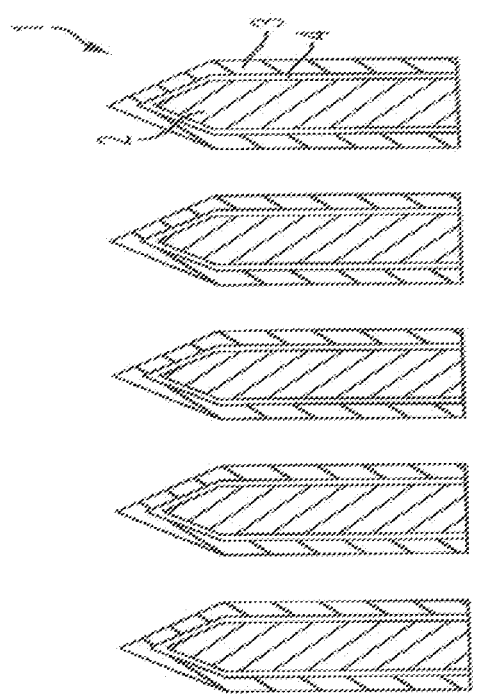
FIG. 2 schematically illustrates a side cross sectional view of a basis of a nanowire LED array in accordance with embodiments of the invention.

FIG. 2 schematically illustrates a nanowire LED structure that may be used in accordance with some embodiments of the invention. In principle, one single nanowire is enough for forming a nanowire LED, but due to the small size, nanowires are preferably arranged in arrays comprising hundreds, thousands, tens of thousands, or more, of nanowires side by side to form the LED structure. For illustrative purposes the individual nanowire LED devices will be described herein as being comprised of nanowires 1 having an n-type nanowire core 2 and a p-type shell 3 at least partly enclosing the nanowire core 2 and an intermediate active layer 4. However, for the purpose of embodiments of the invention nanowire LEDs are not limited to this. For example the nanowire core 2, the active layer 4 and the p-type shell 3 may be made up from a multitude of layers or segments. By controlling growth conditions the final geometry of a LED can range from elongated, narrow "pillar structures" to relatively wide based pyramid structures.

In alternative embodiments, only the core 2 may comprise a nanostructure or nanowire by having a width or diameter below 1 micron, while the shell 3 may have a width or diameter above one micron.

III-V semiconductors are of particular interest due to their properties facilitating high speed and low power electronics and optoelectric devices, such as LEDs and lasers. The nanowires can comprise any semiconductor material, and suitable materials for the nanowire include but are not limited to: GaAs (p), InAs, Ge, ZnO, InN, GaInN, GaN, AlGaInN, BN, InP, InAsP, GaInP, InGaP:Si, InGaP:Zn, GaInAs, AlInP, GaAlInP, GaAlInAsP, GaInSb, InSb, Si. Possible donor dopants for e.g. GaP are Si, Sn, Te, Se, S, etc, and acceptor dopants for the same material are Zn, Fe, Mg, Be, Cd, etc. It should be noted that the nanowire technology makes it possible to use nitrides such as GaN, InN and AlN, which facilitates fabrication of LEDs emitting light in wavelength regions not easily accessible by conventional technique. Other combinations of particular commercial interest include, but are not limited to GaAs, GaInP, GaAlInP, GaP systems. Typical doping levels range from $10^{18}$ to $10^{20}$. A person skilled in the art is familiar with these and other materials and realizes that other materials and material combinations are possible.

Preferred materials for nanowire LEDs are III-V semiconductors such as a III-nitride semiconductor (e.g., GaN, AlInGaN, AlGaN and InGaN, etc.) or other semiconductors (e.g., InP, GaAs). In order to function as a LED, the n-side and p-side of each nanowire 1 has to be contacted, and the present invention provides methods and compositions related to contacting the n-side and the p-side of the nanowires in a LED structure.

Although the exemplary fabrication method described herein preferably utilizes a nanowire core to grow semiconductor shell layers on the cores to form a core-shell nanowire, as described for example in U.S. Pat. No. 7,829,443, to Seifert et al., incorporated herein by reference for the teaching of nanowire fabrication methods, it should be noted that the invention is not so limited. For example, in alternative embodiments, only the core may constitute the nanostructure (e.g., nanowire) while the shell may optionally have dimensions which are larger than typical nanowire shells. Furthermore, the device can be shaped to include many facets, and the area ratio between different types of facets may be controlled. This is exemplified in figures by the "pyramid" facets and the vertical sidewall facets. The LEDs can be fabricated so that the emission layer formed on templates with dominant pyramid facets or sidewall facets. The same is true for the contact layer, independent of the shape of the emission layer.

The use of sequential (e.g., shell) layers may result in the final individual device (e.g., a pn or pin device) having a shape anywhere between a pyramid shape (i.e., narrower at the top or tip and wider at the base) and pillar shaped (e.g., about the same width at the tip and base) with circular or hexagonal or other polygonal cross section perpendicular to the long axis of the device. Thus, the individual devices with the completed shells may have various sizes. For example, the sizes may vary, with base widths ranging from 100 nm to several (e.g., 5) µm, such as 100 nm to below 1 micron, and heights ranging from a few 100 nm to several (e.g., 10) µm.

Figure 3:
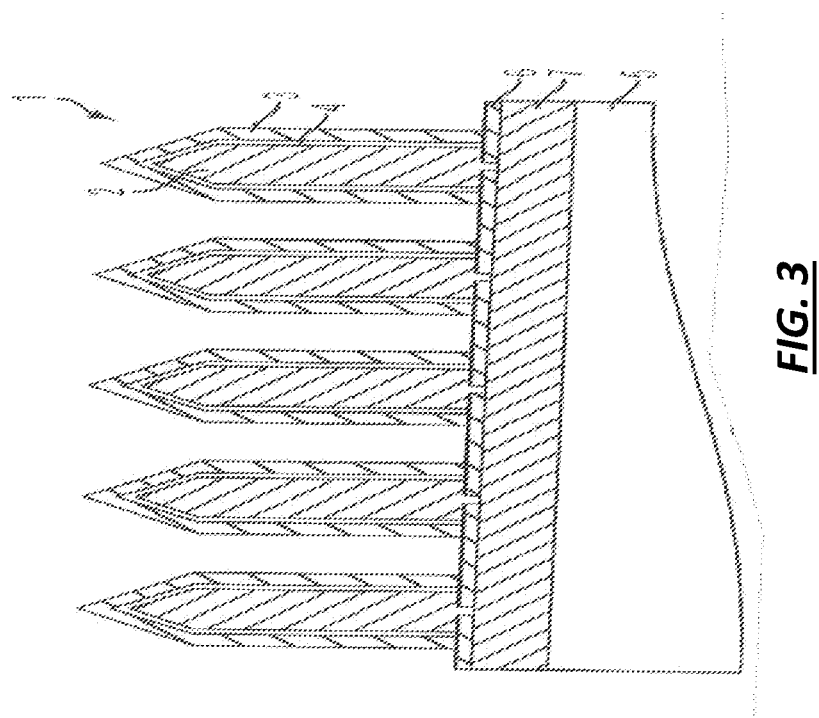
FIG. 3 schematically illustrates a side cross sectional view of a basis of a nanowire LED array on a buffer layer in accordance with embodiments of the invention.

FIG. 3 illustrates an exemplary structure that provides a support for the nanowires. By growing the nanowires 1 on a growth substrate 5, optionally using a growth mask, or dielectric masking layer 6 (e.g., a nitride layer, such as silicon nitride dielectric masking layer, also shown in FIG. 1) to define the position and determine the bottom interface area of the nanowires 1, the substrate 5 functions as a carrier for the nanowires 1 that protrude from the substrate 5, at least during processing. The bottom interface area of the nanowires comprises the area of the core 2 inside each opening in the dielectric masking layer 6. The substrate 5 may comprise different materials such as III-V or II-VI semiconductors, Si, Ge, $Al_2O_3$, SiC, Quartz, glass, etc., as discussed in Swedish patent application SE 1050700-2 (assigned to GLO AB), which is incorporated by reference herein in its entirety. Other suitable materials for the substrate include, but are not limited to: GaAs, GaP, GaP:Zn, GaAs, InAs, InP, GaN, GaSb, ZnO, InSb, SOI (silicon-on-insulator), CdS, ZnSe, CdTe. In one embodiment, the nanowires 1 are grown directly on the growth substrate 5.

In embodiments in which a dielectric masking (growth mask) layer is used, the growth mask 6 may be patterned by photolithography to define openings for the nanowire growth, as described for example in U.S. Pat. No. 7,829,443, incorporated herein by reference in its entirety. In this implementation, the nanowires are grouped in an n-pad area, a non-active area, a LED area (i.e., the area which emits light) and a p-pad area. However, embodiments of the invention are not limited to this. For example the p-pad area may be arranged on top of the nanowires forming the light emitting part of the nanowire LED structure, whereby the p-pad area and the LED area coincide, as described in PCT International Application Publication Number WO 2010/014032 A1 to Konsek, et al., published Feb. 4, 2010 and incorporated herein by reference in its entirety.

Preferably, the substrate 5 is also adapted to function as a current transport layer connecting to the n-side of each nanowire 1. This can be accomplished by having a substrate 5 that comprises a buffer layer 7 arranged on the surface of the substrate 5 facing the nanowires 1, as shown in FIG. 3, by way of example a III-nitride layer, such as a GaN and/or AlGaN buffer layer 7 on a Si substrate 5. The buffer layer 7 provides a structure for contacting the n-side of the nanowires 1. The buffer layer 7 is usually matched to the desired nanowire material, and thus functions as a growth template in the fabrication process. For an n-type core 2, the buffer layer 7 is preferably also doped n-type. The buffer layer 7 may comprise a single layer (e.g., GaN), several sublayers (e.g., GaN and AlGaN) or a graded layer which is graded from high Al content AlGaN to a lower Al content AlGaN or GaN. The nanowires can comprise any semiconductor material, but for nanowire LEDs III-V semiconductors such as a III-nitride semiconductor (e.g., GaN, AlInGaN, AlGaN and InGaN, etc.) or other semiconductors (e.g., InP, GaAs) are usually preferred. The growth of nanowires can be achieved by utilizing methods described in the U.S. Pat. Nos. 7,396,696, 7,335,908, and 7,829,443, and WO201014032, WO2008048704 and WO 2007102781, all of which are incorporated by reference in their entirety herein. It should be noted that the nanowire 1 may comprise several different materials (e.g., GaN core, GaN/InGaN active layer and InGaN shell having a different In to Ga ratio than the active layer). In general the substrate 5 and/or the buffer layer 7 are referred to herein as a support or a support layer for the nanowires. In certain embodiments, a conductive layer (e.g., a mirror or transparent contact) may be used as a support instead of or in addition to the substrate 5 and/or the buffer layer 7. Thus, the term "support layer" or "support" may include any one or more of these elements.

The above description of an exemplary embodiment of a LED structure will serve as a basis for the description of the methods and devices of the invention; however, it will be appreciated that any suitable nanowire LED structure or other suitable nanowire structure may also be used in the methods and devices, with any necessary modifications as will be apparent to one of skill in the art, without departing from the invention.

Figure 4:
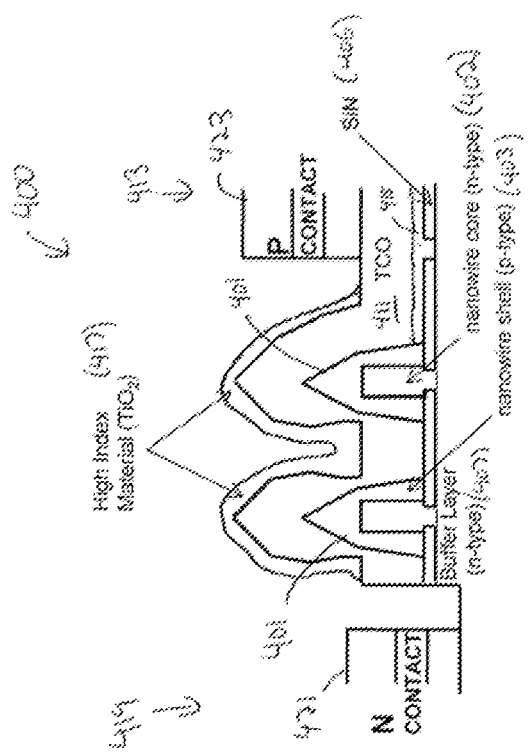
FIG. 4 schematically illustrates a side cross sectional view of a nanowire LED array having a layer of a high index of refraction material over the array in accordance with embodiments of the invention.

FIG. 4 schematically illustrates a nanowire LED device 400 having a layer of a high index of refraction material over at least a portion of a surface of the nanowire LED. The device 400 may include a nanowire array, such as shown above in FIG. 3, that includes a plurality of nanowires 401, such as tapered nanowires that are arranged on a support, where the nanowires 401 comprise a first conductivity type (e.g., n-type) semiconductor core 402 and a second conductivity type (e.g., p-type) shell 403 that are configured to form a pn or pin junction that in operation provides an active region for light generation (e.g., intermediate active layer 4 may also be added as shown in FIG. 3). The solid support may include a buffer layer 407 that is in electrical contact with the nanowire core 402, and a dielectric (e.g., SiN) masking layer 406 that insulates the nanowire shell 403 from the buffer layer 407, both of which may be provided on a bottom substrate layer (not shown). An optional intermediate layer (not shown) may also be provided on the support, and may comprise an undoped GaN layer to reduce the density of crystal defects in the nanowires.

A transparent conductive oxide (TCO) layer 411, such as an ITO layer, may be deposited over the nanowire structure by any suitable method, e.g., sputter deposition, evaporation, etc., to make electrical contact with the outer shells 403 of the nanowires 401 and provide a p-electrode. In some embodiments, a portion of the nanowires may be removed, such as by etching through a mask or by laser ablation, to form a p-side contact area 413, prior to depositing the TCO layer 411. The TCO layer 411 may then be deposited over the nanowires 401 and the p-side contact area 413. A dielectric material 415 (e.g., spin-on-glass (SOG)), may be provided over the p-side contact area 413 to passivate any exposed partially etched nanowires and to electrically isolate the TCO layer 411 from the n-type buffer layer 407.

A layer 417 of a high index of refraction material is formed over the TCO layer 411, as shown in FIG. 4. As stated previously, if the high index material is deposited by evaporation, the film on sidewall features have a lower density than films deposited on substantially horizontal features, such as between the nanowires. The effective index of refraction of the film on the sidewall which is lower density may be lower than the effective index of material on more planar features, such as between the wires. The layer 417 may be a transparent film, and may have an index of refraction, n, that is between about 1.4 and about 4.5 (e.g., 2.0-2.5, such as 2.2-2.4) for at least one emission wavelength of the LED, which may be a visible, infrared (IR) or ultraviolet (UV) wavelength. In one embodiment, the at least one emission wavelength of the nanowire LED may be a visible wavelength, such as between 390-700 nm (e.g., 450-550 nm).

The high index of refraction material layer 417 may be dielectric material, including an oxide or nitride, preferably exhibiting a high transmissivity and low losses over the emission wavelength(s) of the nanowire LED array. Suitable materials include $TiO_2$, which has an index of refraction, n, of between about 2.2 and 2.4 at wavelengths in the 450-550 nm range, and Si-rich $Si_3N_4$, which can have index of refraction, n, of about 2.4 within the 450-550 nm wavelength range. The layer 417 of a high index of refraction material may be formed using any suitable process, such as by physical vapor deposition (PVD) (e.g., electron beam evaporation, sputtering, etc.), chemical vapor deposition (CVD), atomic layer deposition (ALD), etc.

A second portion of the nanowires 401 may be removed, such as by etching through a mask or by laser ablation, to expose the n-type buffer layer 407 and define an n-side contact area 419. N-side and P-side contacts 421, 423 may be formed in the respective n-side and p-side contact areas 419, 413 to produce a device as shown in FIG. 4. The N-side and P-side contacts 421, 423 may be formed using standard photolithography to deposit a mask (e.g., resist) that covers all features except for the n and p contact areas 419, 413. The exposed n and p contact areas 419, 413 may be wet or dry etched to expose the n-GaN layer 407 and TCO layer 411, respectively. Metal contacts may then be formed over the exposed n-GaN layer 407 and TCO layer 411 in the n and p contact areas 419, 413. An exemplary metal contact 421, 423 may comprise an Al/Ti/Au stack, with Al in contact with either the n-GaN (n-contact) or TCO (p-contact). The photoresist mask with metal may then be lifted off the substrate to provide the device 400 of FIG. 4.

The formation of one or both metal contacts may be performed either before or after the high index of refraction material is coated over the nanowire array.

Figure 5:
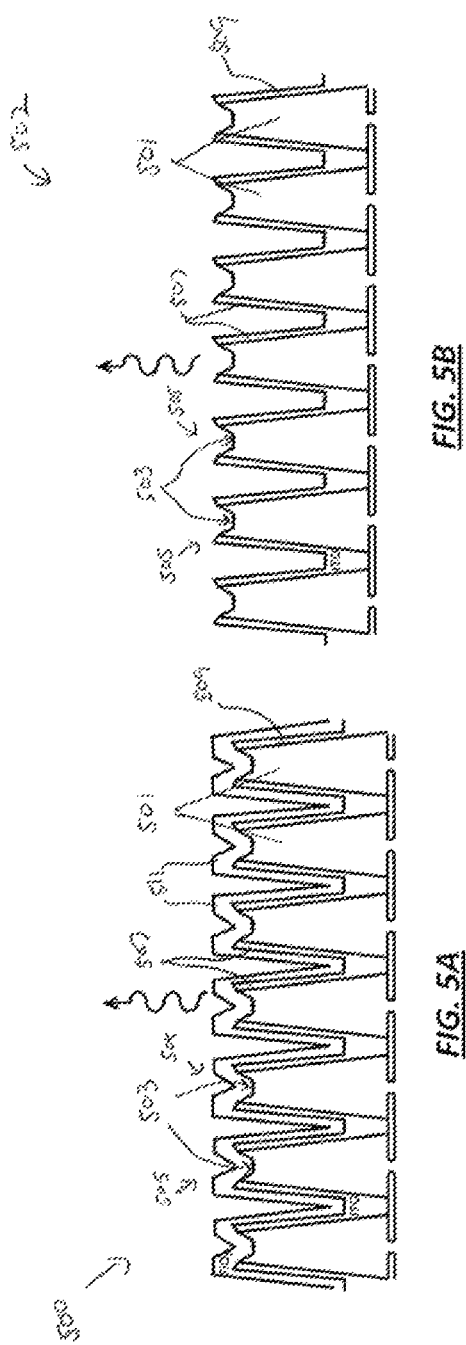
FIG. 5A schematically illustrates a side cross sectional view of a nanowire LED array in which the tip ends of the nanowires have substantially flat surfaces and a layer of the high index of refraction material is provided over the nanowires in accordance with embodiments of the invention.
FIG. 5B schematically illustrates a side cross sectional view of a comparison nanowire LED array which does not include a layer of the high index of refraction material but is otherwise identical to the LED array of FIG. 5A.

In other embodiments, a high index of refraction material may be provided over a nanowire structure having a substantially flat surface at the tip end of the nanowire, such as a nanowire structure described in U.S. provisional applications Ser. Nos. 61/718,884 and 61/719,133 filed on Oct. 26, 2012. For example, all or a portion of the conically-shaped tips of the nanowires in an array such as shown in FIGS. 2-4 may be selectively removed to provide tips having a substantially flat surface while leaving the sidewalls intact and undisturbed. As used herein, a tip having a "substantially flat" surface includes tips having an exactly flat top surface, as well as tips having a top surface that extends concavely inwards from the end(s) of the sidewall(s) (as shown in FIG. 5A, for example) as well at tips having a top surface that extends convexly outwards above the end(s) of the sidewall(s), where the radius of curvature of the convexly-extending top surface is at least as great as the distance by which the top surface extends above the end(s) of the sidewall(s). The nanowires may be coated with a high index of refraction material. FIG. 5A schematically illustrates a nanowire LED device 500 including a plurality of nanowires 501 having a substantially flat surface 503 at the tip ends 505 of the nanowires 501. A TCO layer 507, such as an ITO layer extends over the sidewalls 509 of the nanowires 501, but not over the substantially flat surface 503 of the tip ends 505 to avoid shorting the TCO layer 507 to the n-type nanowire core. A high index of refraction material layer 511, such as $TiO_2$, extends over the nanowires 501, including over the substantially flat surface 503 at the tip ends 505 of the nanowires 501 and over the TCO layer 507 along the sidewalls 509 of the nanowires 501. An embodiment of a method for removing nanowire tips and coating the nanowires with a high index of refraction material to provide a device 500 as in FIG. 5A is as follows:

1. In a nanowire array, such as shown in FIG. 3, the nanowires are removed from the n-side and p-side contact areas by either laser ablation or by mask and etch. This prevents an n-to-p short forming in future steps, and planarizes the areas for future wire bonding.

2. Next a dielectric is deposited on the support. The dielectric can be deposited by spin on methods, chemical vapor deposition, or physical vapor deposition. The preferred method is chemical vapor deposition of $SiO_2$. In one preferred embodiment, the nanowires are about 2.5 μm tall, the dielectric is about 1000- about 6000 Å thick, most preferably about 4000 Å as measured on the planar surface at the bottom.

3. Next, a mask of photoresist is applied to the n- and p-side contact areas, and the dielectric is removed in unmasked areas by wet or dry etch. Wet etch by dilute hydroflouric acid (HF) is preferred to avoid plasma damage. It is preferred to leave some dielectric material (e.g., $SiO_2$) at the base of the nanowires while removing the dielectric material from the nanowire tips and sidewalls. In an alternative embodiment, $SiO_2$ may be deposited by the spin technique (spin on glass, or SOG), and the SOG may be partially removed where it is thin by etching in HF acid, leaving thicker SOG at the base of the nanowires and in between nanowires, whilst leaving exposed GaN nanowires on the middle and upper portions of the wire, as described in U.S. provisional patent application Ser. No. 61/832,350, filed on Jun. 7, 2013, titled "Nanowire LED Structure With Decreased Leakage and Method of Making Same", naming Scott Brad Herner, Cynthia Lemay, Carl Patrik Theodor Svensson and Linda Romano as co-inventors. Other dielectric films may be used, such boron-doped $SiO_2$ (BSG), phosphorus doped $SiO_2$ (PSG), boron and phosphorus doped $SiO_2$ (BPSG), low k dielectrics such as Si—C—O—H, high k films such as $Al_2O_3$ or $HfO_2$, and other suitable dielectrics. This step may be omitted if no SOG is added.

4. A transparent conductive film (TCF) 507 such as indium tin oxide (ITO) is deposited next. Other TCO films such as aluminum doped zinc oxide (AZO) can also be used. Alternatively, the transparent conductive film may be composed of two components which may be deposited in separate depositions. The components may have different compositions. For example, the first TCF deposited may be ITO deposited by evaporation, followed by AZO deposited by chemical vapor deposition, as described in U.S. provisional patent application Ser. No. 61/787,299, filed on Mar. 15, 2013, titled "Two Step Transparent Conductive Film Deposition Method and GaN Nanowire Devices Made By The Method", naming Scott Brad Herner as inventor. The film can be deposited by physical methods, such as evaporation or sputtering, by CVD, or by a combination of methods. The ITO film can be about 100 Å to about 10,000 Å thick, preferably about 8,000 Å. An optional dielectric film, such as $SiO_2$ may then be deposited on top of the ITO. The dielectric can be deposited by spin on methods, evaporation or sputtering, or by CVD. It is most preferably deposited by spin on methods, resulting in a thin film on the tip, and thicker film at the base of the wires where it is planar.

Figure 6:
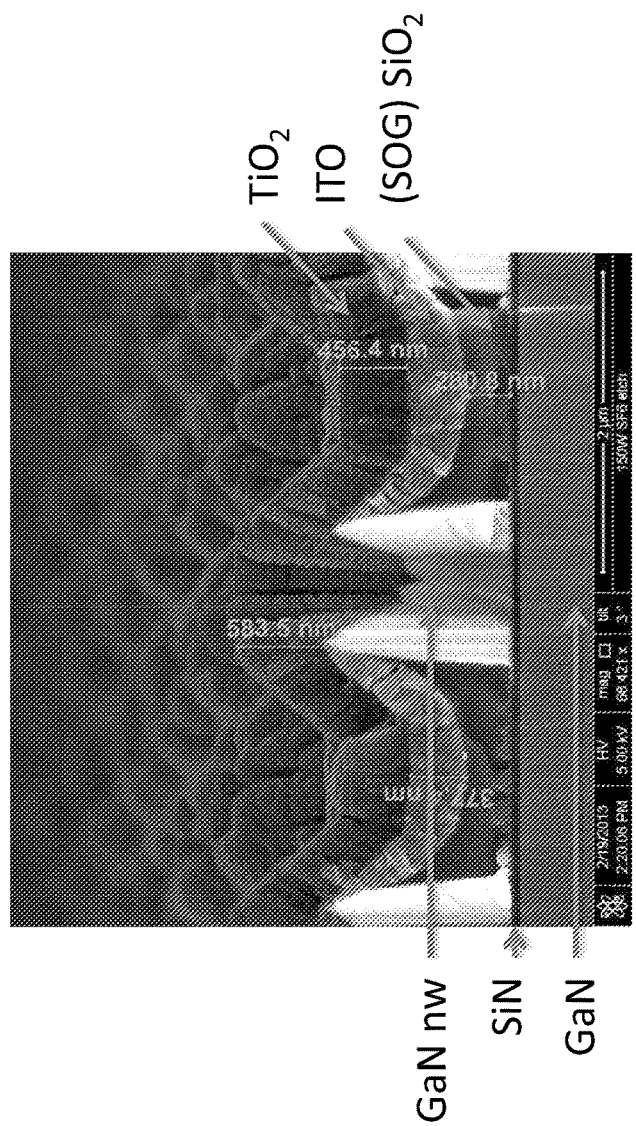
FIG. 6 is a scanning electron microscope image of a GaN nanowire with tip removed, and ITO and $TiO_2$ films on the nanowire.

5. In the next step, the device is dry etched in chlorine gas plasma without a mask on the device. Chlorine will etch $SiO_2$, ITO, and GaN. The GaN has the fastest etch rate of the three films, resulting in the profile at the tip end 505 of the nanowires 501 as shown in FIG. 5A. A scanning electron microscope (SEM) image is shown in FIG. 6, where the nanowire has a flattened top due to tip removal by dry etch, and ITO and $TiO_2$ layers are on the sidewalls. A layer of SOG is evident at the foot of the nanowire, and on top of the SiN film. Due to the anisotropic nature of the etch, the tips are etched faster than the sidewalls. Thus, the conically-shaped tips of the nanowires, as shown in FIGS. 1-4, are removed to provide a nanowire tip having a substantially flat surface 503, as shown in FIG. 5A. The ITO contact material and/or portions of the nanowire sidewalls may extend above the substantially flat surface 503 to provide a concave profile at the nanowire tips, as shown in FIG. 5A. The dielectric film ($SiO_2$) deposited in step 4 protects the ITO on the sidewalls of the nanowire during the etch. For clarity, this dielectric material (e.g., $SiO_2$) is not illustrated in FIG. 5A, although it will be understood that at least some of this material may remain following the above-described etching step that removes the nanowire tips, or it may be completely removed. The slower etch rate and thicker films at the base of the nanowires ensures that the materials at the base of the nanowires remain after the nanowire tip has been removed by etching.

6. A layer 511 of a high index of refraction material is formed over the nanowires, including over the substantially flat surface at the tip ends of the nanowires and the TCO material, as shown in FIG. 5A. The layer 511 may be a transparent film, and may have an index of refraction, n, that is between about 1.75 and about 4.5 (e.g., 2.0-2.5, such as 2.2-2.4) for at least one emission wavelength of the LED, which may be a visible, infrared (IR) or ultraviolet (UV) wavelength. In one embodiment, the at least one emission wavelength of the nanowire LED may be a visible wavelength, such as between 390-600 nm (e.g., 450-550 nm). The high index of refraction layer may be dielectric material, including an oxide or nitride, preferably exhibiting a high transmissivity and low losses over the emission wavelength(s) of the nanowire LED array. Suitable materials include $TiO_2$, which has an index of refraction, n, of between about 2.2 and 2.4 at wavelengths in the 450-550 nm range, and Si-rich $Si_3N_4$, which has an index of refraction, n, of about 2.4 within the 450-550 nm wavelength range. The layer of high index of refraction material may also comprise $SiO_xN_y$. The layer of a high index of refraction material may be formed using any suitable process, such as by physical vapor deposition (PVD) (e.g., evaporation, sputtering, etc.), chemical vapor deposition (CVD), atomic layer deposition (ALD), etc.

7. In the next step, standard lithography is used to mask a mesa pattern with photoresist, and films are removed in the future n- contact area and around the mesa edge to define and isolate the device.

8. Standard lithography is used to deposit a mask (e.g., resist) that covers all features except for the n and p contact areas. These exposed n and p contact areas are wet or dry etched to remove dielectric from them, exposing the nGaN and TCO, respectively. A metal contact stack consisting of Al, Ti, and Au is then deposited by evaporation. The photoresist mask with metal is then lifted off the device, leaving the contact stacks in the n and p contact areas.

9. Finally, a transparent dielectric film such as $SiO_2$ or an organic material such as epoxy is deposited over the entire device to passivate and protect the device. The dielectric or organic film is selectively removed from the metal contact areas by masking and etching.

This method described above for removing the tips of nanowires may be suitably modified by a person of skill in the art and it is apparent that a person of skill in the art may perform the steps in any suitable order, and not specifically the order described above. For example, the formation of one or both metal contacts may be performed either before or after the high index of refraction material is coated over the nanowire array.

Figure 7B:
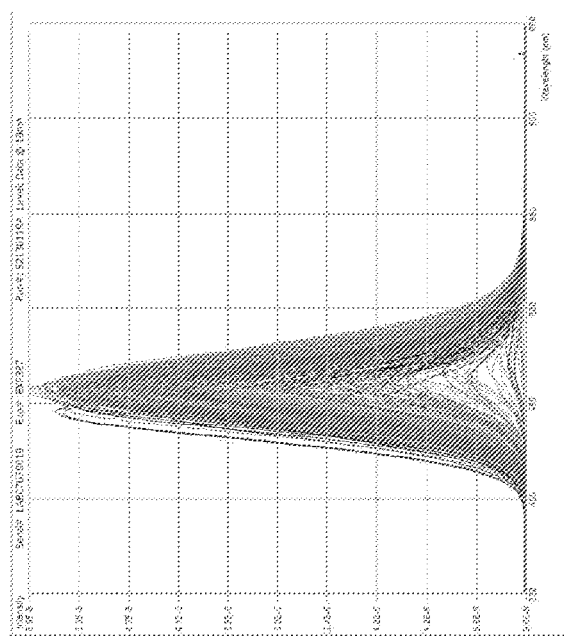
FIG. 7B is a plot of the intensity versus wavelength emitted by a comparison device such as shown in FIG. 5B.
Figure 7A:
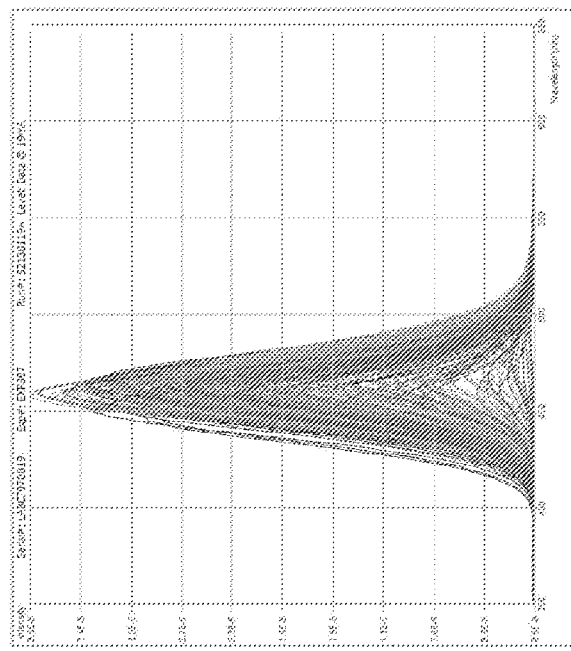
FIG. 7A is a plot of the intensity versus wavelength emitted by an embodiment device of a GaN nanowire LED having a high index of refraction material over the nanowires as shown in FIG. 5A.

FIG. 5B illustrates a comparison device 502, which is identical to the device 500 of FIG. 5A, but without the layer of high index of refraction material 511. FIG. 7A is a plot of the intensity versus wavelength emitted by an embodiment device of a GaN nanowire LED having a high index of refraction material over the nanowires as shown in FIG. 5A. FIG. 7B is a plot of the intensity versus wavelength emitted by a comparison device 502 without a high index of refraction material but otherwise identical to the embodiment device, such as shown in FIG. 5B. FIG. 7A shows a peak intensity of $5.9 \times 10^{-5}$ mWatts for the embodiment device, providing a peak external quantum efficiency of 4.4% at 19 mA applied current. In contrast, FIG. 7B shows a peak intensity of $3.8 \times 10^{-5}$ mWatts for the comparison device, providing a peak external quantum efficiency of 2.8% at 19 mA applied current. Thus, the addition of a transparent, high index of refraction layer, such as a $TiO_2$ film, may improve the extraction efficiency, and therefore the external quantum efficiency, of LED devices based on GaN nanowires. In embodiments, the external quantum efficiency of a nanowire LED device having a high index of refraction material layer may be increased by a factor of 1.1-3.0 (e.g., 1.4-1.7, such 1.5-1.6) relative to the external quantum efficiency of the same device without a high index of refraction material layer. Without wishing to be bound by theory, it is believed that the improved light extraction in the device of FIG. 5A is due to light being guided "out" normal to the plane of the wafer.

Figure 8:
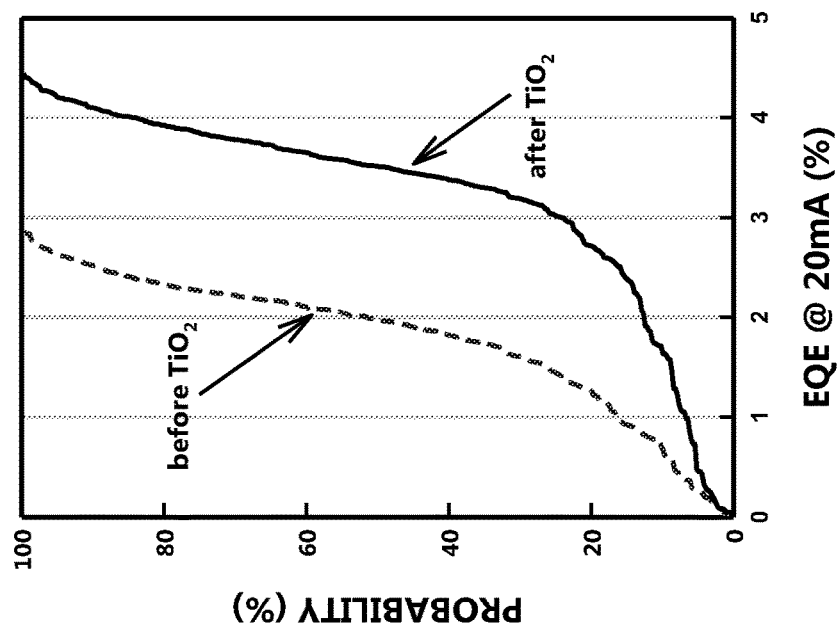
FIG. 8 is a probability plot of external quantum efficiency (EQE) for >500 nanowire LED die on one support, measured at 20 mA, both before and after deposition of a $TiO_2$ layer.

FIG. 8 is a probability plot of external quantum efficiency (EQE) for >500 nanowire LED die, a die being one device with a group of nanowires, on one support, measured at 20 mA, both before and after deposition of a high index of refraction $TiO_2$ layer, as described in the above embodiments. As shown in FIG. 8, at least about 75% of the nanowire LED die with a high index of refraction $TiO_2$ layer had an external quantum efficiency (EQE) of 3.0% or more, such as 3.0-4.3%, at 20 mA. By contrast, essentially none of these same die had an EQE of 3.0% or more at 20 mA prior to the deposition of a high index of refraction $TiO_2$ layer.

Although the present invention is described in terms of nanowire LEDs, it should be appreciated that other nanowire based semiconductor devices, such as field effect transistors, diodes and, in particular, devices involving light absorption or light generation, such as, photodetectors, solar cells, laser, etc., can be implemented on any nanowire structures.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

The foregoing method descriptions are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not necessarily intended to limit the order of the steps; these words may be used to guide the reader through the description of the methods. Further, any reference to claim elements in the singular, for example, using the articles "a," "an" or "the" is not to be construed as limiting the element to the singular.

The preceding description of the disclosed aspects is provided to enable any person skilled in the art to make or use the present invention. Various modifications to these aspects will be readily apparent to those skilled in the art, and the generic principles defined herein may be applied to other aspects without departing from the scope of the invention. Thus, the present invention is not intended to be limited to the aspects shown herein but is to be accorded the widest scope consistent with the principles and novel features disclosed herein.

What is claimed is:

1. A semiconductor device, comprising:
   a plurality of first conductivity type semiconductor nanowire cores located over a support;
   a plurality of second conductivity type semiconductor shells extending over and around the respective nanowire cores;
   a layer of a high index of refraction material over at least a portion of a surface of at least one of the nanowire cores and the shells, wherein the high index of refraction material has an index of refraction that is between about 1.4 and about 4.5 and wherein the high index of refraction material comprises a dielectric material; and
   a silicon oxide layer over at least a portion of a surface of at least one of the nanowire cores and the shells and below the layer of high index of refraction material, wherein the silicon oxide layer has an index of refraction that is lower than the index of refraction of the high index of refraction material.

2. The semiconductor device of claim 1, wherein the device comprises a nanowire LED.

3. The semiconductor device of claim 2, wherein the first conductivity type semiconductor nanowire core and the second conductivity type semiconductor shell are configured to form a pn or pin junction that in operation provides an active region for light generation.

4. The semiconductor device of claim 2, wherein the nanowire LED is configured to generate light in at least one emission wavelength in the visible, ultraviolet or infrared range, and the high index of refraction material has an index of refraction that is between about 1.4 and about 4.5 for the at least one emission wavelength.

5. The semiconductor device of claim 4, wherein the at least one emission wavelength is between 350 to 650 nm.

6. The semiconductor device of claim 4, wherein the high index of refraction material has an index of refraction that is between about 2.0 and 2.5 for the at least one emission wavelength.

7. The semiconductor device of claim 4, wherein the layer of the high index of refraction material has a transmissivity of greater than about 85% for the at least one emission wavelength.

8. The semiconductor device of claim 1, wherein the high index of refraction material comprises at least one of an oxide and a nitride.

9. The semiconductor device of claim 8, wherein the high index of refraction material comprises $TiO_2$.

10. The semiconductor device of claim 9, wherein the high index of refraction material comprises at least one of $Si_3N_4$ and $SiO_xN_y$.

11. The semiconductor device of claim 1, further comprising:
a transparent, electrically conductive material over at least a portion of the surface of the second conductive type semiconductor shell, such that the layer of high index of refraction material is located over the transparent, electrically conductive material.

12. The semiconductor device of claim 11, wherein the transparent, electrically conductive material comprises a transparent conductive film electrode of the device.

13. The semiconductor device of claim 1, wherein each nanowire core and respective shell form a structure having a base, proximate to the support, and at least one sidewall extending from the base to a tip end of the structure, wherein the layer of high index of refraction material is provided over at least one of the tip end and the at least one sidewall of the structure.

14. The semiconductor device of claim 13, wherein the tip end of the structure comprises a substantially flat surface, and the layer of high index of refraction material is provided over the substantially flat surface of the tip end and at least partially along a sidewall of the structure.

15. The semiconductor device of claim 13, further comprising a transparent, electrically conductive material over the sidewall but not the tip end of the structure, such that the layer of high index of refraction material is located over the transparent, electrically conductive material over at least part of the sidewall.

16. The semiconductor device of claim 13, wherein the tip end of the structure comprises a substantially conical-shaped tip and the layer of high index of refraction material is provided over the substantially conical-shaped tip and at least partially along a sidewall of the structure.

17. The semiconductor device of claim 2, wherein the nanowire LED comprises a GaN-based nanowire LED.

18. The semiconductor device of claim 2, wherein an external quantum efficiency of the nanowire LED device having a high index of refraction material layer is increased by a factor of 1.1-3.0 relative to the external quantum efficiency of the same device without a high index of refraction material layer.

19. The semiconductor device of claim 2, wherein at least about 75% of the nanowire LEDs having a high index of refraction material layer on the support have an external quantum efficiency of greater than 3.0% at 20 mA.

20. The semiconductor device of claim 1, wherein the semiconductor nanowire cores comprise a III-V semiconductor material.

21. The semiconductor device of claim 20, wherein the III-V semiconductor material comprises at least one of GaAs, GaAs, GaAsP, InAs, Ge, ZnO, InN, GaInN, GaN, AlGaInN, BN, InP, InAsP, GaInP, InGaP:Si, InGaP:Zn, GaInAs, AlInP, GaAlInP, GaAlInAsP, GaInSb, InSb, InN and AlN.

22. The semiconductor device of claim 1, wherein the semiconductor shells comprise a III-V semiconductor material.

23. The semiconductor device of claim 20, wherein the III-V semiconductor material comprises at least one of GaAs, GaAs, GaAsP, InAs, Ge, ZnO, InN, GaInN, GaN, AlGaInN, BN, InP, InAsP, GaInP, InGaP:Si, InGaP:Zn, GaInAs, AlInP, GaAlInP, GaAlInAsP, GaInSb, InSb, InN and AlN.

* * * * *